TRANSISTOR OSCILLATOR HAVING INTERCHANGEABLE
REACTIVE NETWORKS
Filed March 28, 1968
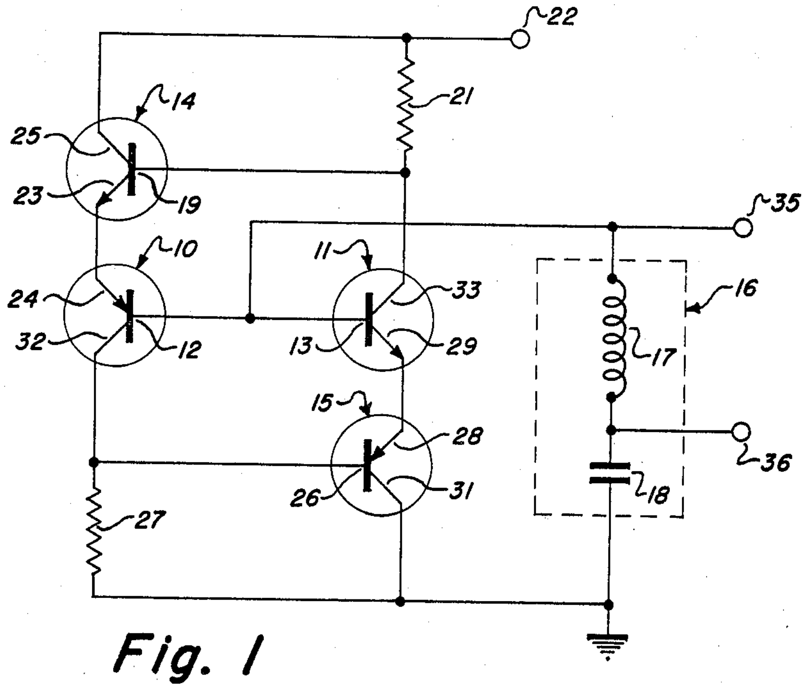
Fig. 1
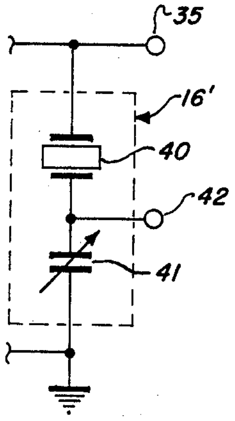
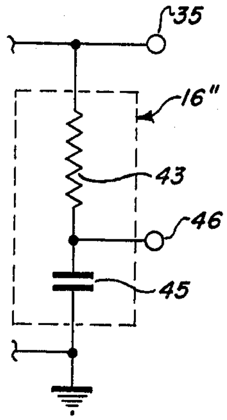
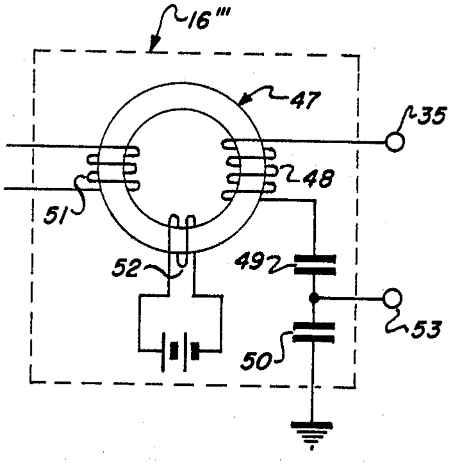
Fig. 1a Fig. 1b Fig. 1c
INVENTOR.
John B. Noe
BY
Roland A. Anderson
Attorney United States Patent Office
3,475,698
Patented Oct. 28, 1969

3,475,698

TRANSISTOR OSCILLATOR HAVING INTERCHANGEABLE REACTIVE NETWORKS

John B. Noe, Albuquerque, N. Mex., assignor to the United States of America as represented by the United States Atomic Energy Commission Filed Mar. 28, 1968, Ser. No. 716,761
Int. Cl. H03b *5/12*
U.S. Cl. 331—108 6 Claims

ABSTRACT OF THE DISCLOSURE

A stable oscillator including four transistors, a rate controlling reactive network, and associated resistors. Two of the transistors of opposite conductive types and opposite conductive states have their base electrodes joined directly together with the reactive network connected between their junction and ground. The conductive states of these transistors are continuously switched at a predetermined rate through their common emitter connection to the respective emitters of the other two transistors, also of opposite conductive types, which are connected in the emitter-follower circuit configuration between a source of bias potential and ground. The common emitter connections are between transistors of opposite conductive types. The switching rate of the transistors is controlled by the time constant of the reactive network, across which the output is normally taken.

BACKGROUND OF INVENTION

With the advancement of the art of solid state devices, a great deal of present day electronic equipment has adopted the modular form of construction. Modular construction makes it convenient to use well-known electronic circuits in a variety of system applications. One such circuit which would be convenient in modular form is the oscillator. However, there are many types of oscillators, the majority of which are designed with limited characteristics. For an oscillator to be put into modular form, it must have broad characteristics such as a wide range of frequency selections and various types of output signals, as well as frequency stability over wide temperature variations. It should be possible to change the oscillator characteristics by a mere change of an oscillator component. This component can be either a piezoelectric crystal, a series or parallel resonant LC or RC circuit. This, of course, puts limitations on some oscillator circuits because a change in the frequency determining component requires a change in other circuit parameters. If a change is required in individual circuit components which are a part of the module, then the modular concept is defeated.

In prior art oscillators, it is difficult to find an oscillator that can be constructed in modular form where a wide range of frequencies can be selected and various output signals can be obtained by merely changing the reactive network across the oscillator output terminals.

SUMMARY OF INVENTION

Basically the oscillator circuit of this invention employs four transistors and associated resistors with a first pair of transistors having their base electrodes connected in common and a second pair of transistors connected in the emitter-follower circuit configuration, the second pair of transistors being adapted to control the conductive states of the first pair. This much of the circuit can be of modular construction. A reactive network is connected between the common connected base electrodes of the first pair of transistors and ground for a desired oscillator frequency and output signal. If there is a need for a high voltage alternating signal, the reactive network may be a series LC circuit with the capacitor connected to the ground side of the circuit. At the junction between the inductor and capacitor a voltage of greater than thirty times the supply voltage is easily realized. For use in a time base generator or for generating a clock signal or for providing reference markers, a crystal of fixed frequency may be connected across the output terminals. If there is a need for an integrated or differentiated output signal, an RC network may be employed; for an integrated output signal, the capacitor may be connected to the ground side of the circuit; for a differentiated output signal, the resistor may be connected on the ground side of the circuit. In each case, the output signal is taken between the junction of the two components and ground.

The oscillator is essentially a complementary bistable circuit with its mode of operation in class "D," since the active elements are either saturated or cut off except during switching time. The circuit is essentially a complementary switch so that drive is supplied for each half cycle, resulting in cancellation of even orders of distortion. Odd orders of distortion are low due to the fact that the transistors switch at the alpha cutoff rate regardless of the frequency of oscillation.

It is, therefore, a general object of this invention to provide an improved transistor oscillator circuit which is capable of operating with any reactive network to furnish selective frequencies.

It is a further object of this invention to provide an improved oscillator circuit where the elements of the reactive network can be selected to furnish desired output signals.

It is yet a further object of this invention to provide an improved oscillator circuit that lends itself to modular construction.

Another object of this invention is to provide an improved oscillator circuit capable of voltage amplification many times its own supply voltage.

A further object of this invention is to provide an improved oscillator circuit having little or no distortion due to the transistor switching at the transistor's alpha cutoff rate.

BRIEF DESCRIPTION OF THE DRAWINGS

Embodiments of the present invention are shown in the accompanying drawings wherein:

FIG. 1 is a schematic diagram illustrating a preferred embodiment of the transistor oscillator circuit;

FIG. 1*a* is a modification wherein the reactive network comprises a piezoelectric crystal in series with a variable capacitor;

FIG. 1*b* is another modification wherein the reactive network comprises a series connected RC circuit; and FIG. 1*c* is still another modification wherein the reactive network comprises a ferrite core having input, output and bias windings with associated capacitors to provide a current controlled oscillator.

Referring to FIG. 1, the transistor oscillator of this invention is seen to be a complementary bistable circuit. A first complementary pair of transistors 10 and 11 have their respective base electrodes 12 and 13 common connected. A second complementary pair of transistors 14 and 15 are connected in an emitter-follower circuit configuration. A reactive network 16, including inductor 17 and capacitor 18, is connected in series between the common connected base electrodes 12 and 13 of transistors 10 and 11, respectively, and ground. For illustrative purposes only, transistors 10 and 15 are shown as PNP type and transistors 11 and 14 are shown as NPN type. It is only necessary, however, to the operation of the circuit of this invention that transistors 10 and 11 be of opposite conductive type and also that transistors 14 and 15 be opposite in type to transistors 10 and 11, respectively. Thus within the scope of this invention each of transistors 10, 11, 14 and 15, as shown in FIG. 1, may be replaced by its opposite conductive type with appropriate reversal of supply voltage polarity. The emitter-follower circuit of transistor 14 has its base electrode 19 biased through resistor 21 to the positive supply voltage connected at terminal 22. Emitter electrode 23 is connected directly to emitter electrode 24 of transistor 10 and collector electrode 25 is connected directly to the positive supply voltage. Transistor 15, like its complementary transistor 14, also connected in the emitter-follower configuration, has its base electrode 26 returned to ground through resistor 27 and its emitter electrode 28 connected directly to emitter electrode 29 of transistor 11. Collector electrode 31 is returned directly to ground.

Bias for transistor 10 is by way of the common connection of emitter electrodes 23 and 24 of transistors 14 and 10, respectively, collector electrode 32 being connected directly to base electrode 26 of transistor 15 at its junction with resistor 27. Transistor 11 is similarly biased by the common connection of emitter electrodes 29 and 28 of transistors 11 and 15, respectively, collector electrode 33 being directly connected to base electrode 19 of transistor 14 at its junction with resistor 21.

OPERATION OF THE CIRCUIT

The oscillator is a complementary bistable circuit so that while transistors 10 and 14 are conducting transistors 11 and 15 will be nonconducting and vice versa. In describing the operation of the oscillator circuit, let it be assumed initially that transistors 10 and 14 are turned on and transistors 11 and 15 are turned off. Transistors 10 and 14 will always turn on first when a potential is applied at terminal 22 because capacitor 18 will be at 0 volt. Base electrode 12 of transistor 10 is at the same potential which appears as a short, thus the current path is easiest through transistors 10 and 14. Under these conditions, transistor 14 draws its base current through resistor 21 and transistor 10 is turned on by the current from emitter electrode 23 of transistor 14 which partly flows through base electrode 12 of transistor 10 to ground through reactive network 16. With these transistors saturated, the collector-to-base voltage drop across transistor 10 will be only a few tenths of a volt. This is not sufficient voltage to forward bias the base-to-emitter junction of transistors 11 and 15. These transistors 11 and 15, therefore, are turned off and the current that flows through resistor 21 must be going into base electrode 19 of transistor 14 as originally assumed. The circuit will remain in this state until the current through the reactive network will no longer keep transistor 10 saturated. When transistor 10 comes out of saturation the base-to-emitter voltage on transistors 11 and 15 will increase to the point that these transistors are turned on. With transistors 11 and 15 turned on, the current through resistor 21 is shorted to ground and will not flow into base electrode 19 of transistor 14; therefore, transistors 10 and 14 are turned off. The circuit will remain in this state as long as the base electrode current to transistor 11, supplied from the energy stored in reactive network 16, is sufficient to keep this transistor saturated. The current flowing from the reactive network 16 into base electrode 13 of transistor 11 and hence into emitter electrode 28 of transistor 15 will keep transistors 11 and 15 turned on. For this circuit to oscillate, reactive network 16 must store up energy from base electrode 12 of transistor 10 for one-half cycle of the oscillation period and supply energy to base electrode 13 of transistor 11 for the other half cycle of the oscillation period.

The operation of the oscillator circuit has been described for any reactive network 16; however, the preferred embodiment includes an inductor 17 and capacitor 18 connected in series between the common connected base electrodes 12 and 13 of respective transistors 10 and 11 and ground. For reactive network 16 and other modifications thereof to be described below, the output signal at terminal 35 with respect to ground will always be a square wave with an amplitude close to the supply voltage and a repetition rate controlled by the time constant of the reactive network. In this circuit, and particularly reactive network 16, inductor 17 and capacitor 18 comprise a series resonant LC circuit and for most applications of the oscillator the Q of the inductor should be high. This provides a very stable circuit because the conducting time of transistors 10 and 14 is set by the ring charge time of the LC circuit, while transistors 11 and 15 will be held on or conducting during the ring discharge of the LC circuit. When the square wave voltage generated at the top of inductor 17 is inserted into the LC circuit, the voltage that appears across either inductor 17 or capacitor 18 is considerably higher than the applied square wave voltage at terminal 35. The ratio of the reactive voltage to the applied voltage is equal to the ratio of reactance to resistance. This ratio is also the Q of the circuit where the resistance would be mostly that of the inductor which would be relatively small. Therefore, the voltage across either inductor 17 or capacitor 18 is equal to QE where E is the voltage inserted in the circuit. This high voltage and high impedance sinusoidal output is taken from terminal 36 connected between the junction of inductor 17 and capacitor 18. The high alternating voltage taken between terminal 36 and ground can be used for a simple AC to DC power supply. Where it would be desirable to provide lower voltages and lower impedances, a minor change can be made in the reactive network; for example, capacitor 18 may consist of several elements to permit outputs at intermediate capacitance values.

While it is understood that the circuit specifications of the oscillator of the present invention may vary according to the desired design for any particular application, the following circuit specifications for the circuit of FIG. 1 to provide an output of 1000 volts are included by way of example only.

| | | |
|---|---|---|
| Transistors: | | |
| 10 and 15, PNP | | 2N2907 |
| 11 and 14, NPN | | 2N2222 |
| Resistors 21 and 27 | ohms | 2000 |
| Supply voltage | volts | +30 |
| Inductor 17 ($Q \cong 33$) | mh | 100 |
| Capacitor 18 | μfd | .0025 |
| Oscillator frequency | kHz | 10 |

A modification of reactive network 16 is shown in FIG. 1*a*; the basic circuit is the same as the one shown in FIG. 1 with the exception that crystal 40 and variable capacitor 41 comprise reactive network 16′. In actuality, crystal 40 replaces an LC resonant circuit because it is theoretically equivalent to an RLC circuit. However, the frequency of a crystal controlled oscillator is held constant to a high degree of accuracy by the use of a quartz crystal. It is understood that when a potential difference is applied across the faces of a crystal it deforms or changes shape. This characteristic of the crystal, known as the piezoelectric effect, causes the crystal to behave as a high Q resonant circuit. Crystal 40 in this circuit will readily vibrate at its mechanical resonant frequency and because of its electrical properties, crystal 40 will behave as though there were an LC circuit with an extremely high Q. Capacitor 41 permits slight adjustment of the crystal frequency to the precise desired frequency. The inclusion of capacitor 41 in series with crystal 40 produces a sinusoidal output at terminal 42 because of the predominantly inductive element of the crystal. If a square wave is desirable from output terminal 35 for a particular application, it will have a repetition rate as stable as the resonant frequency of the crystal. The upper frequency limit of oscillation is dependent on the beta cutoff of the transistors. It should be pointed out that in the oscillator circuit of this invention, crystals can be changed in reactive network 16' for a plurality of desired frequencies without changing any other circuit component.

A further modification of the oscillator circuit shown in FIG. 1 is obtained by replacing reactive network 16 with reactive network 16'' shown in FIG. 1*b*. This network comprises an RC network made up of resistor 43 and capacitor 45. In this circuit the output signal from terminal 46 will have a wave form that is a time integral of the square wave formed at terminal 35. As mentioned above, for the circuit of FIG. 1 to oscillate the reactive network 16 must store up enough energy from base electrode 12 of transistor 10 for one-half cycle of the oscillation period and supply energy to base electrode 13 of transistor 11 for the other half cycle of the oscillation period. Where reactive network 16'' is a series RC circuit, such as resistor 43 and capacitor 45, then the circuit will charge with a time constant $$\left[\frac{\beta_{10}+1}{\beta_{14}+1}R_{21}+R_{43}\right]C$$

where $\beta_{10}$ is the beta of transistor 10, $\beta_{14}$ is the beta of transistor 14; $R_{21}$ is the resistance value of resistor 21 of the circuit of FIG. 1; and $R_{43}$ and C constitute the respective values of resistor 43 and capacitor 45 of the reactive network 16''. When capacitor 45 is charged, transistors 10 and 14 turn off and capacitor 45 discharges with a time constant $$\left[\frac{\beta_{15}+1}{\beta_{11}+1}R_{27}+R_{43}\right]C$$

through transistors 11 and 15. In this equation, $\beta_{11}$ and $\beta_{15}$ are the betas of transistors 11 and 15, respectively, $R_{27}$ is the resistance value of resistor 27, and $R_{43}$ and C remain the same as in the previous equation.

A minor modification of reactive network 16'' consisting of reversing resistor 43 with capacitor 45, changes the wave form from output terminal 46 to a time differential of the square wave formed at terminal 35. The period of oscillation can be calculated using the above equations except that the output signal is differentiated.

A further modification of reactive network 16 of FIG. 1 is shown in FIG. 1*c* where reactive network 16''' includes ferrite core 47 having its output winding 48 connected in series between terminal 35 of FIG. 1, series connected capacitors 49 and 50, and ground. Ferrite core 47 also has an input winding 51 and bias winding 52. This combination provides a current controlled oscillator where a small DC voltage applied to input winding 51 will cause a flux change under output winding 48. A flux change under winding 48 will cause a frequency change in the oscillator. The magnetic ferrite core of 47 has a square hysteresis loop, better known as the B–H loop. On the B–H loop there exists a region of constant rate of change of permeability. Proper bias voltage applied to bias winding 52 places the ferrite core for operation in a linear frequency region. A small DC voltage change received, for example, from a transducer, will cause a frequency change in the oscillator which is directly proportional to the applied DC voltage. The varying frequency is taken from terminal 53 and may be employed, for example, to modulate a carrier frequency in a telemetering system.

Other modifications of this circuit falling within the scope of the invention as described herein will be readily apparent to those skilled in this art.

What is claimed is:

1. A transistor oscillator comprising:

a first and a second transistor of opposite conductive types having common connected base electrodes, a third and a fourth transistor connected in emitter-follower configuration, said third and fourth transistors being opposite in type to said first and second transistors, respectively, means for connecting said transistors to a source of DC potential for biasing said transistors, the emitter electrodes of the first and second transistors being common connected with the emitter electrodes of the third and fourth transistors, respectively the collector electrode of the first transistor being connected to the base electrode of the fourth transistor and the collector electrode of the second transistor being connected to the base electrode of the third transistor, the collector electrode of said fourth transistor connected to ground, and a reactive network connected between the junction of the common connected base electrodes of the first and second transistors and ground, whereby the states of conduction of the first and second transistors may be switched in response to changes in the states of conduction of the third and fourth transistors, respectively, at a rate determined by the time constant of the reactive network.

2. A transistor oscillator as in claim 1 wherein said reactive network consists of an inductor connected serially through a capacitor to ground, said network having an output terminal at the junction of the inductor and capacitor, whereby an amplified sinusoidal wave form may be obtained between said last mentioned junction and ground.

3. A transistor oscillator as in claim 1 wherein said reactive network consists of a variable capacitor connected serially through a piezoelectric crystal to ground, said network having an output terminal at the junction of the variable capacitor and the crystal, whereby a sinusoidal wave form substantially determined by the resonant frequency of the crystal may be obtained between said last mentioned junction and ground.

4. A transistor oscillator as in claim 1 wherein said reactive network consists of a resistor connected serially through a capacitor to ground, said network having an output terminal at the junction of said resistor and capacitor, whereby a wave form may be obtained between said last mentioned junction and ground constituting a time integral of the squarewave formed between the junction of the common connected base electrodes of the first and second transistors and ground.

5. A transistor oscillator as in claim 1 wherein said reactive network consists of a capacitor connected serially through a resistor to ground, said network having an output terminal at the junction of said capacitor and resistor, whereby a wave form may be obtained between said last mentioned junction and ground consisting of a time differential of the squarewave formed between the junction of the common connected base electrodes of the first and second transistors and ground.

6. A transistor oscillator as in claim 1 wherein said reactive network consists of a ferrite core having input, output and bias windings, the output winding being connected in series between the junction of the base electrodes of the first and second transistors and two serially connected capacitors having capacitance in predetermined ratio, said capacitors being connected to ground, a DC voltage applied to the bias winding for operating the core in a linear frequency region, and an output terminal at the junction of the serially connected capacitors, whereby a sinusoidal wave form may be obtained between the junction of said capacitors and ground, the frequency of said wave form being variable in response to variations in a DC voltage applied to said input winding.

References Cited

UNITED STATES PATENTS 3,268,738 8/1966 Deavenport ---------- 331—111

OTHER REFERENCES

Cola: "Looking for a 'Universal' Circuit?", Electronic Design, Feb. 1, 1967, pp. 48–51.

ROY LAKE, Primary Examiner

SIEGFRIED H. GRIMM, Assistant Examiner

U.S. Cl. X.R.

331—111, 116, 117, 181